United States Patent

[11] 3,600,677

[72] Inventor Kozo Uchida
Tokyo, Japan

[21] Appl. No. 810,625
[22] Filed Mar. 26, 1969
[45] Patented Aug. 17, 1971

[73] Assignee Iwatsu Electric Company, Ltd.
Tokyo, Japan

[32] Priority Apr. 2, 1968
[33] Japan
[31] 43/21229

[54] WIDE BAND GATE CIRCUITS WITH FEEDBACK CIRCUITS
10 Claims, 5 Drawing Figs.

[52] U.S. Cl. ........ 324/103 P, 307/256, 307/257, 328/151
[51] Int. Cl. ........ G01r19/16, H03k 17/00
[50] Field of Search ........ 324/103, 120; 307/256, 257, 258, 259; 328/151, 101, 186

[56] References Cited

UNITED STATES PATENTS

| | | | |
|---|---|---|---|
| 2,782,307 | 2/1957 | vonSivers et al. | 307/257 |
| 2,866,103 | 12/1958 | Blake et al. | 307/257 |
| 3,011,129 | 11/1961 | Magleby et al. | 328/101 X |
| 3,201,641 | 8/1965 | Thorne | 307/257 X |
| 3,229,212 | 4/1966 | Rogers | 328/186 X |
| 3,248,655 | 4/1966 | Kobbe et al. | 328/186 X |
| 3,294,961 | 12/1966 | Hose | 307/257 X |
| 2,917,717 | 12/1959 | Thorsen | 307/259 X |
| 3,139,587 | 6/1964 | Peck | 307/259 X |
| 3,146,357 | 8/1964 | Spallone | 307/259 X |
| 3,389,272 | 6/1968 | Cherry | 307/259 X |

*Primary Examiner*—Rudolf V. Rolinec
*Assistant Examiner*—Ernest F. Karlsen
*Attorney*—Chittick, Pfund, Birch, Samuels & Gauthier

ABSTRACT: The wide band gate circuit with a feedback circuit comprises at least one series element including a first and a second diodes connected in series opposition, an input terminal connected to one end of the series element to receive a signal to be measured, an output terminal connected to the other end of the series element, a third diode connected to the junction between the first and second diodes to apply a gate pulse from a gate pulse generator to cause said signal to flow between input and output terminals and to prevent a portion of the input signal from being reflected by the gate pulse generator back to the input terminal, a condenser connected between the output terminal and the ground to store the amplitude of said signal, a shunt element including a large capacitance and connected between the ground and the junction between the first and second diodes so as to prevent a leakage signal from appearing on the output terminal, an amplifier connected to the output terminal, a shaping circuit to accumulate and maintain the peak value of the output from the amplifier and a feedback circuit to feedback at least a portion of the signal accumulated in the shaping circuit to all of the diodes.

PATENTED AUG 17 1971 3,600,677

INVENTOR

KOZO UCHIDA

KOZO UCHIDA, INVENTOR

BY

Chittick, Pfund, Birch, Samuels and Gauthier
ATTORNEY

INVENTOR

KOZO UCHIDA

WIDE BAND GATE CIRCUITS WITH FEEDBACK CIRCUITS

BACKGROUND OF THE INVENTION

This invention relates to a wide band gate circuit with a feedback circuit and is suitable to be utilized as a sampling oscilloscope and the like for deriving high frequency signals.

A gate circuit has an input terminal and an output terminal. Normally, the electrical path between these terminals is maintained nonconductive but the path is rendered conductive only when a gate pulse of very narrow width is applied so that a signal to be measured applied to the input terminal appears on the output terminal.

Since there is a stray capacitance between the output terminal and the ground and since there is a resistance between input and output terminals, even when the gate circuit is conductive, the gate circuit has a time constant determined by the product of the stray capacitance and resistance. Where the source of the signal to be measured includes an impedance the time constant becomes larger. During the interval in which the gate pulse is being applied, the input signal charges the stray capacitance. However, since the interval of application of the gate pulse is not sufficiently large, the charged voltage or the derived out signal is smaller than the input signal. Such a wide band gate circuit is usually comprised by a diode and as is well known in the art the diode has a nonlinear characteristic with the result that the derived out signal has a nonlinear distortion.

The more shorter the period of the gate pulse the more higher is the frequency of the signal that can be derived out. Thus, the gate circuit can operate over a wider band but the derived out signal becomes smaller owing to the time constant. The relationship between the band width $f_o$ and the interval of pulse $\tau$ can be expressed by $$\tau f_o = 0.44$$

If $\tau$ equals to 60 pico seconds (PS), then $f_o$ equals to approximately 7 gigaHertz (GHz.).

A gate circuit of such a wide band is constituted by a diode. During the nonconductive state the diode has a capacitance of about 0.5 picofarad (pf.) between terminals and a resistance of more than several megohms (MΩ) so that the input signal will appear on the output terminal through these impedances. This means that there is a leakage of the signal. Consequently a signal corresponding to the derived out signal upon which the leakage signal is superposed is amplified by a low frequency amplifier connected to the output terminal thus resulting in the distortion of the waveform. Thus, the wider the frequency band the smaller is the signal derived out, so that the output signal will be greatly influenced by the leakage signal thus resulting in larger distortion of the waveform. In this manner, the low frequency characteristics are impaired.

The signal to be measured is applied to one terminal of a diode constituting a gate circuit and the gate pulse is applied to the other terminal. The impedance of a gate pulse generator when viewed from the terminal to which the gate pulse is applied (the output impedance of the gate pulse generator) is low and is greatly influenced by the frequency. Even when the diode is nonconductive this impedance acts as a load for the input terminal through the capacitance between terminals whereby the waveform of the signal to be measured is distorted to cause irregularities in the frequency characteristics in the high frequency region. The gate pulse generator is difficult to effect output impedance matching over a wide hand. In other words, the V.S.W.R. (voltage standing wave ratio) is large. In order to make narrow the width of the generated gate pulse, the gate pulse generator normally utilizes a shorting circuit to decrease the pulse width to the interval of time required for a signal to trip forward and backward through the shorting circuit. However, the V.S.W.R. of this shorting circuit is infinitely large thus effecting total reflection, and since this reflection acts as a load for the input terminal through the capacitance between terminals during nonconductive state of the diode, a portion of the signal to be measured supplied to the input terminal will be reflected by the gate pulse generator including the shorting circuit back to the input terminal through the interterminal capacitance so that the reflected wave will be superposed upon the signal to be measured, thus distorting the waveform. Thus, the high frequency characteristics become irregular and degraded. According to one approach to solve this problem, a wide band attenuator of small V.S.W.R. is utilized between the gate pulse generator and the gate circuit. Where an attenuator of the attenuation of 6 decibels (db.) is used the reflected wave can be reduced to one-fourth but the gate pulse applied to the gate circuit is also attenuated to one half Thus, in order to obtain a gate pulse having the same amplitude as that of the pulse generated where no attenuator is utilized, the gate pulse generator is required to produce pulses of twice large amplitude. This is very difficult to attain from the standpoint of engineering.

SUMMARY OF THE INVENTION

It is therefore an object of this invention to provide a new and improved wide band gate circuit which can eliminate the nonlinearity caused by the diode, can improve the low frequency characteristics by eliminating the leakage signal and can improve the high frequency characteristics by preventing a portion of the signal to be measured from reaching the gate pulse generator and being reflected thereat back to the input terminal.

According to the broad aspect of this invention, there is provided a wide band gate circuit with a feedback circuit comprising at least one series element including a first diode and a second diode connected in series opposition, an input terminal connected to one end of the series element to receive a signal to be measured, an output terminal connected to the other end of the series element, a source of gate pulse, a third diode connected to the junction between the first and the second diodes to apply the gate pulse to cause the signal to flow between the input and output terminals during the interval of the gate pulse, a condenser connected between the output terminal and the ground to store the amplitude of said signal, a shunt element including a large capacitance and connected between the ground and the junction between the first and second diodes, said shunt element acting to prevent a leakage signal from appearing on the output terminal, said third diode serving to prevent a portion of the signal to be measured from being reflected by the gate pulse generator back to the input terminal, an amplifier connected to the output terminal, a shaping circuit to accumulate and maintain the peak value of the output from the amplifier and a feedback circuit to feedback at least a portion of the signal accumulated in the shaping circuit to all of said diodes.

The amplitude of the gate pulse current flowing through the third diode can be varied by varying the bias voltage applied across the third diode. Between the output terminal and the amplifier is connected a differential amplifier comprising a pair of field effect transistors. The gate electrode of one of the transistors is connected to the output terminal while the gate electrode of the other is coupled to the feedback circuit to interrupt the feedback signal.

According to the modified embodiment of this invention, a pair of series elements, each including a pair of diodes connected in series opposition, are connected in parallel to form a diode bridge.

BRIEF DESCRIPTION OF THE DRAWING

The invention can be more fully understood from the following detailed description when taken in conjunction with the accompanying drawing in which.

DESCRIPTION OF THE PREFERRED EMBODIMENTS

Figure 1:
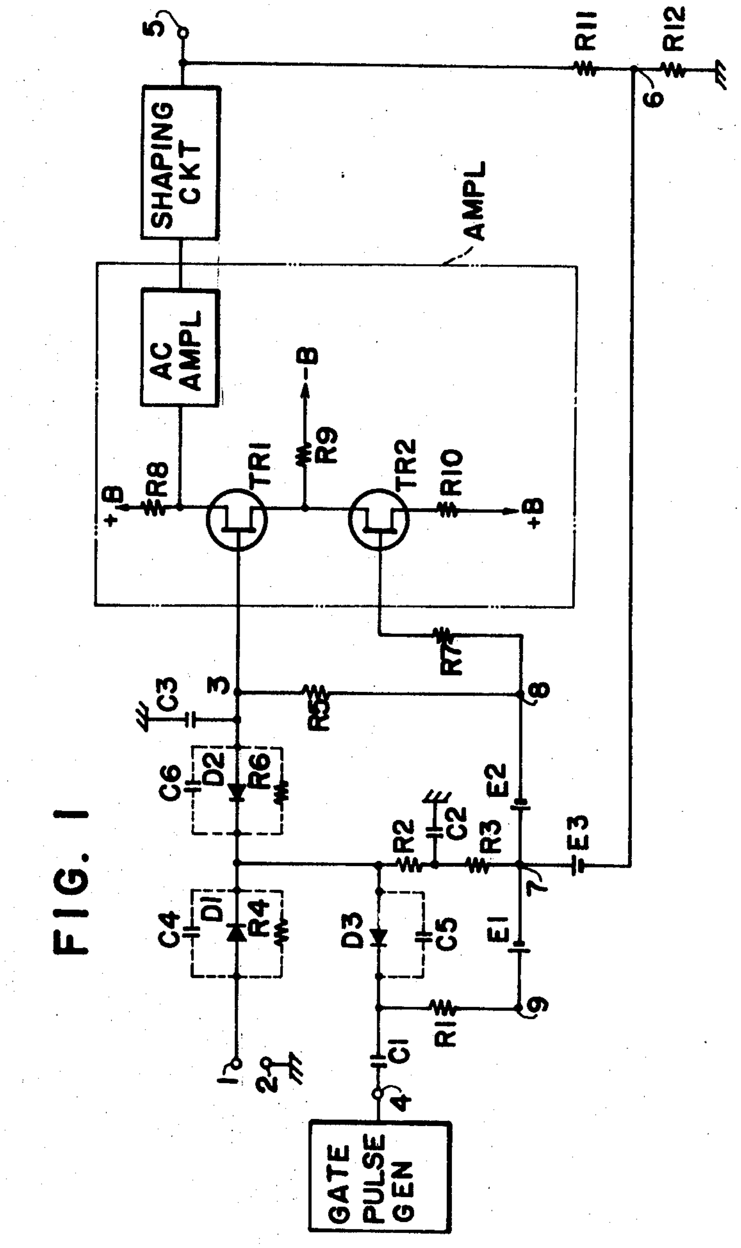
FIG. 1 shows an electrical connection diagram of one embodiment of this invention.

Referring now to the accompanying drawing, one embodiment illustrated in FIG. 1 comprises an input terminal 1 to receive a signal to be measured, a grounded terminal 2, and an output terminal 3 from which the amplitude of the signal to be measured is derived out during the interval of a gate pulse, the terminal 3 being connected to the gate electrode G of a field effect transistor TR1. The gate circuit further comprises three diodes D1, D2 and D3, terminals 7, 8 and 9 for applying to these diodes to normally maintain them in nonconductive state, bias resistors R2, R3, R5 and R1 bias sources E1, E2 and E3, a gate pulse generator P for applying a negative gate pulse to diodes D3, D1 and D2 through a terminal 4 to overcome bias voltages supplied from bias sources E1, E2 and E3 thus rendering conductive these diodes. There are also provided a condenser C3 which is connected between output terminal 3 and the ground to store the amplitude of the signal to be measured, a condenser C1 for blocking the bias voltage from being applied to the gate pulse generator P and a condenser C2 for grounding (for high frequencies) one terminal of resistor R2 to terminate the gate pulse. Capacitances between terminals of diodes D1, D2 and D3, which appear when they are nonconductive, are represented by C4, C5 and C6 respectively while insulation resistances of diodes D1 and D2 when they are nonconductive are represented by R4 and R6 respectively.

Field effect transistors TR1 and TR2 comprise a differential amplifier. The gate electrode G of transistor TR2 is connected to a terminal 8 via a resistor R7, the respective source electrodes S are connected together and are then connected to a source −B through a resistor R9 and the drain electrodes D of transistors TR1 and TR2 are respectively connected to a source +B through resistors R8 and R10. Further, the drain electrode D of transistor TR1 is connected to an AC amplifier, the output thereof being coupled to a shaping circuit. The shaping circuit functions to accumulate and preserve the peak value of the output from the AC amplifier. The output form the shaping circuit is supplied to terminal 5 and is also fed back to terminal 7 through bias source E3 from a junction 6 between a pair of resistors R11 and R12 which constitute an attenuator.

Diode D3 is normally maintained nonconductive and the circuit is constructed such that the gate pulse is applied to the junction between diodes D1 and D2 through diode D3. Capacitances C4, C5 and C6 have a value of about 0.5 pf. Resistor R2 operates to match with the output impedance of the gate pulse generator and has a value of about 50 ohms. Terminal 1 is terminated by a matched characteristic impedance of the order of 50 ohms. To operate the resistor R2 as a terminal resistor with respect to the gate pulse the capacitor C2 may have a value of several 10 pf. but it is advantageous to select this value to be extremely larger value, for example, about 1000 pf. when compared with capacitance C4.

More particularly, by causing capacitance C4 and resistance R4 to act as the series element of a L-type attenuator with respect to the input signal and by causing resistor R2 and condenser C2 to act as the shunt element thus making extremely large the attenuation ratio of the attenuator in the frequency band of the AC amplifier following terminal 3, the leakage signal is attenuated and is then applied to the AC amplifier. Then even when a leakage signal of less than the lower limit frequency or above the upper limit frequency of the AC amplifier exists, such a leakage will not be amplified by the AC amplifier so that it is able to obtain the required signal alone. In this manner, it is possible to improve the low frequency characteristics.

Figure 2:
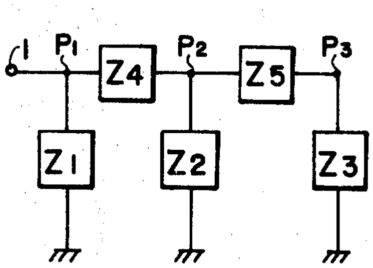
FIG. 2 shows an equivalent circuit of the circuit shown in FIG. 1.
Figure 3:
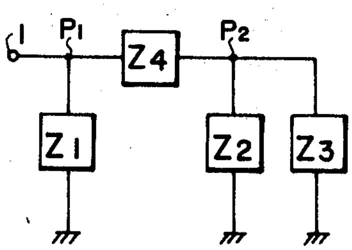
FIG. 3 shows an equivalent circuit of the circuit shown in FIG. 1 excepting a resistor R1 and a diode D3.

FIG. 2 shows an equivalent circuit of the circuit shown in FIG. 1 and FIG. 3 shows an equivalent circuit of FIG. 1 from which resistor R1, diode D3 and bias source E1 have been eliminated and condenser C1 has been connected to the junction between diodes D1 and D2. In FIGS. 2 and 3, Z1 represents an impedance of a terminal element, Z2 an impedance comprised by resistor R2 and condenser C2, Z3 an output impedance of the gate pulse generator, Z4 an impedance of capacitance C4 (at high frequencies since resistance R4 is sufficiently higher than the impedance of capacitance C4, this impedance is negligible), and Z5 the impedance of capacitance C5. Impedance Z1 is substantially constant over the entire frequency band whereas impedances Z4 and Z5 decrease as the frequency increases. On the other hand, impedance Z3 greatly varies with the frequency. This causes irregularity in the frequency characteristics at terminal 1 with the result that the reflected wave is superposed upon the input waveform, thus causing it to distort.

Turning now to FIG. 3, where the frequency is less than 0.5 gigaHertz (GHz.), as the impedance Z4 is sufficiently high, the signal to be measured applied to terminal 1 will scarcely appear on point P2. Such a small signal will be reflected by the impedance Z3 and will be further attenuated while it passes through impedance Z4. For this reason, substantially no effect of the reflected wave appears on the input terminal 1. However, when the frequency is increased beyond about 1 GHz., impedance Z4 decreases so that a substantial quantity of the signal to be measured will pass through impedance Z4 and will be reflected by impedance Z3 back to point P1 through impedance Z4. The signal is attenuated when it travels forwardly from point P1 to point P2, and is further attenuated during its backward travel from point P2 to point P1. However, such attenuations are not significant. These attenuations correspond to those of a pair of $\pi$-type attenuators.

However, when impedance Z5 is added as shown in FIG. 2, even when the frequency is increased, the signal will be successively attenuated while it travels from point P1 to point P2, from point P2 to point P3, from point P3 to point P2 and from point P2 to point P1 with the result that the magnitude of the reflected wave returning to terminal is decreased to a very small value. This function corresponds to that of two sets of serially connected $\pi$-type attenuators. As a result, the frequency characteristics are improved especially at very high frequencies, thus greatly contributing to the improvement of the pulse characteristics, and to the elimination of the distortion of waveforms. The attenuation of the gate pulse when diode D3 is rendered conductive is very small.

Figure 4:
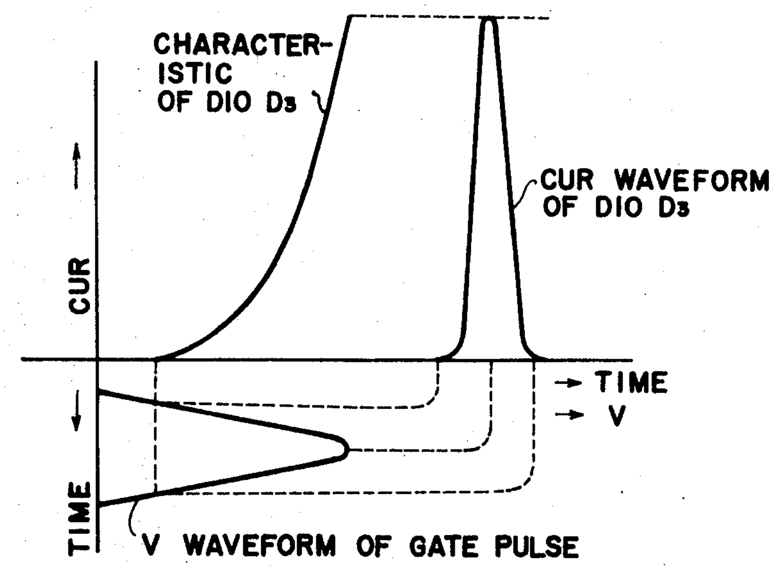
FIG. 4 is a graph showing the characteristics of a diode and FIG. 5 shows a circuit diagram of a modified embodiment of this invention.

As shown in FIG. 4, the current-voltage characteristic of diode D3 is nonlinear. For this reason, when a gate pulse is applied across this diode it is able to obtain a pulse much steeper than the applied waveform. Also it is possible to readily vary the amplitude of the current waveform passing through diode D3 by adjusting the bias voltage applied thereto.

As shown in FIG. 1, a bias voltage is applied to the junction between resistor R2 and condenser C2 through resistor R3. However, this bias voltage may be applied directly to the junction between diodes D1 and D2 through a suitable connecting means. It is also possible to reverse the polarity of diodes D1, D2 and D3 and of the gate pulse and to apply suitable bias voltages.

Referring again to FIG. 1, the feedback signal $V_f$ fed back from junction 6 between resistors R11 and R12 has the same polarity as the input signal $V_i$. Signal $V_f$ has a waveform corresponding to the enlargement of the interval of the input signal $V_i$ and when an instant of gating is considered $V_f \approx V_i$. An error signal between signals $V_f$ and $V_i$ is produced by diodes D1 and D2, which is amplified by the AC amplifier to accumulate and maintain the peak value by means of the shaping circuit. In this manner, a waveform corresponding to the enlargement of the interval of the input signal $V_i$ or a waveform similar to that of signal $V_i$ is produced at the output terminal 5. As the circuit is constructed to derive out only error signals, the signal $V_f$ is a negative feedback signal. If, however, this signal $V_f$ were fed back through the amplifying and shaping circuits without its peak value being accumulated and maintained signal $V_f$ will have the same polarity as signal $V_i$ thus providing a positive feedback. As a result, an oscillation occurs. In order to prevent this positive feedback of signal $Vf$, in the arrangement shown in FIG. 1, a differential amplifier comprising field effect transistors TR1 and TR2 is utilized to cut off signal $Vf$. Alternatively, the signal $Vf$ can be cut off by operating an AC amplifier by means of the difference between signal component derived out from input signal $Vi$ under the control of the gate pulse and a frequency component of the signal $Vf$ the frequency of which has been greatly reduced or by using a differential amplifier together with the AC amplifier. With these means only the error signal between signals $Vi$ and $Vf$ can be utilized to provide the desired negative feedback which functions to effectively eliminate the nonlinear characteristics of diodes D1 and D2.

If the voltage applied across diode D3, shown in FIG. 1, were not maintained at 1 constant value the amplitude of the gate pulse applied to the junction between diodes D1 and D2 would be varied so that again the output signal would be distorted nonlinearly. By applying signal $Vf$ to the cathode electrode of diode D3 through resistor R1, the bias voltage across diode D3 can be maintained at a constant value, thus eliminating the nonlinear distortion.

Figure 5:
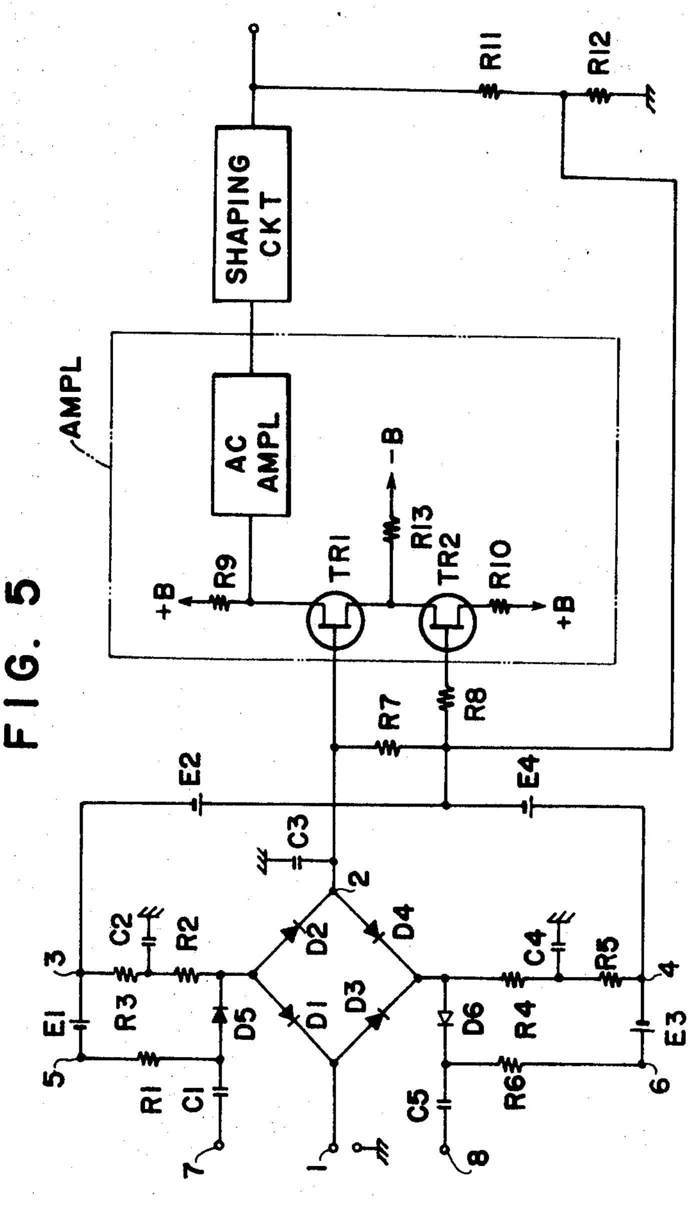

FIG. 5 illustrates another embodiment of this invention. This embodiment comprises a bridge arrangement of four diodes D1, D2, D3 and D4. A junction between diodes D1 and D3 is connected to input terminal 1 arranged to receive the signal to be measured while output terminal 2 of the bridge is connected to the gate electrode G of field effect transistor TR1. Junctions between diodes D1 and D2 and D3 and D4 are respectively connected to bias terminals 3 and 4 through resistors R2, R3 and R4, R5, in the same manner as in FIG. 1. These junctions are also connected to bias terminals 5 and 6 respectively through resistor R1 and diode D6 (corresponding to diode D3 of FIG. 1) and through resistor R6 and diode D5 (corresponding to diode D3 of FIG. 1) and to terminals 7 and 8, across which the gate pulse is applied, via blocking condensers C1 and C2, respectively. Condensers C2 and C4 correspond to condenser C2 of FIG. 1 and condenser C3 corresponds to condenser C3 of FIG. 1.

A bias source E1 is connected between terminals 3 and 5, and a bias source E3 between terminals 4 and 6 (sources E1 and E3 correspond to source E1 of FIG. 1) and bias sources E2 and E4 are serially connected between terminals 3 and 4. The feedback signal is applied to the junction between bias sources E2 and E4 from the junction between resistors R11 and R12. Other component elements of the circuit and their operation are identical to those already described in connection with FIG. 1.

In FIG. 1, it is possible to insert the input signal by first open circuiting the connection shown and connecting the input line across the junction between diode D3 and resistor R2 and the junction between diodes D1 and D2. Similarly, the input line can also be connected between diode D3 and resistor R2. Similar alternate connections are also possible in FIG. 5.

As has been pointed out, as the band width is broadened, the amplitude of the output signal decreases and the effect of the leakage signal becomes larger, or the low frequency characteristics degrade. In addition, the reflection of the signal to be measured from the gate pulse generator increases at higher frequencies, thus degrading the high frequency characteristics. Further, nonlinearity of the circuit causes waveform distortion. As described hereinabove, according to this invention low and high frequency characteristics as well as the nonlinear characteristic of the wide band gate circuit can be readily improved by simple means. Such improvement of the low frequency characteristics can be attained over a band width of more than 0.5 GHz. and when the shunt element of the circuit has a capacitance of more than 300 pf.

Furthermore, this invention can eliminate reflections from the pulse generator to improve high frequency characteristics. In this manner, it is possible to supply pulses of a constant amplitude to the gate circuit from the gate pulse generator.

What I claim is:

1. A wide band gate circuit with a feedback circuit comprising at least one series element including a first diode and a second diode connected in series opposition; an input terminal for receiving a signal to be measured, said input terminal being connected to one end of said series element; an output terminal connected to the other end of said series element; a source of gate pulse; a third diode connected to the junction between said first and second diode; means to apply a gate pulse from said source of gate pulse through said third diode to pass said signal between said input and output terminals only during the interval of said gate pulse; a condenser connected between said output terminal and the ground to store the amplitude of said signal; a shunt element including a relatively low value resistor connected to said junction and a large capacitance connected between said resistor and ground said shunt element acting to prevent a leakage signal from appearing on said output terminal; said third diode and shunt element serving to prevent a portion of said signal to be measured from being reflected by said gate pulse generator back to said input terminal; an amplifier connected to said output terminal; a shaping circuit to accumulate and maintain the peak value of the output from said amplifier; and a feedback circuit to feedback at least a portion of the signal accumulated in said shaping circuit to all of said diodes.

2. A wide band gate circuit with a feedback circuit comprising a series element including a pair of diodes of opposite polarities; an input terminal connected to one terminal of said series element; means to apply a signal to be measured to said input terminal; an output terminal connected to the other end of said series element; a gate pulse generator; means to apply a gate pulse generated by said gate pulse generator to the junction between said pair of diodes through a third diode; means to normally maintain all of said diodes in nonconductive state; means to render conductive all of said diodes during the interval of said gate pulse; means to store the amplitude of said signal in a capacitance connected between said output terminal and the ground during said interval; a shunt element including a relatively low value resistor connected to said junction and a capacitance of more than 300 pf. connected between said resistor and the ground; an amplifier connected to said output terminal; a shaping circuit connected to the output of said amplifier to accumulate and maintain the peak value of the output from said amplifier; and a feedback circuit having a band width of more than 0.5 GHz. to feedback at least a portion of the signal accumulated and maintained in said shaping circuit to all of said diodes, said shunt element serving to prevent a leakage signal from being amplified by said amplifier to appear on the output thereof and said third diode and shunt element acting to prevent a portion of said signal to be measured from being reflected by said gate pulse generator back to said input terminal.

3. The gate circuit according to claim 2 wherein said gate pulse is peaked by the action of said third diode.

4. The gate circuit according to claim 2 wherein the bias voltage applied across said third diode is varied to vary the amplitude of the gate pulse current flowing through said third diode.

5. The gate circuit according to claim 2 wherein a differential amplifier is connected between said output terminal and said amplifier, one input of said differential amplifier is connected to said output terminal and the other input of said differential amplifier is connected to said feedback circuit to interrupt the signal fed back through said feedback circuit.

6. The gate circuit according to claim 5 wherein said differential amplifier comprises two field effect transistors.

7. A wide band gate circuit with a feedback circuit comprising a diode bridge including four diodes connected in a bridge configuration; means to apply a signal to be measured to an input terminal of said diode bridge; a fifth diode with one electrode connected to the junction between the first and second diodes of said bridge; a gate pulse generator; means to apply a gate pulse from said gate pulse generator to the other electrode of said fifth diode; a sixth diode with one electrode connected to the junction between the third and fourth diodes of said bridge; means to apply a gate pulse from said generator to the other electrode of said sixth diode;. means to normally maintain all of said diodes in nonconductive state; means to render conductive all of said diodes during the interval of said gate pulse, a capacitor connected between the output terminal of said diode bridge and the ground to store the amplitude of the output signal; shunt elements each including a relatively low value resistor connected to one of said junctions and a capacitance of more than 300 pf. connected between said resistors and the ground; an amplifier connected to said output terminal of said diode bridge; a shaping circuit connected to accumulate and maintain the peak value of the output from said amplifier; and a feedback circuit having a band width of more than 0.5 GHz. to feed back at least a portion of said accumulated and maintained signal to all of said diodes, said shunt elements serving to prevent a leakage signal from being amplified by said amplifier to appear on the output thereof and said fifth and sixth diodes and said shunt elements acting to prevent a portion of said signal to be measured from being reflected by said gate pulse generator back to said input terminal.

8. The gate circuit according to claim 7 wherein said gate pulse is peaked by said fifth and sixth diodes.

9. The gate circuit according to claim 7 wherein the bias voltage applied to the fifth and sixth diodes is varied to vary the amplitude of the gate pulse current flowing through these diodes.

10. The gate circuit according to claim 7 wherein a differential amplifier is connected between said output terminal and said amplifier, one input of said differential amplifier is connected to said output terminal and the other input of said differential amplifier is connected to said feedback circuit to interrupt the signal fed back through said feedback circuit.

PO-1050
(5/69)

UNITED STATES PATENT OFFICE
CERTIFICATE OF CORRECTION

Patent No. 3,600,677 Dated August 17, 1971

Inventor(s) Kozo Uchida

It is certified that error appears in the above-identified patent and that said Letters Patent are hereby corrected as shown below:

Column 1, line 66, "hand" should be -- band --.

Column 3, line 41, "form" should be -- from --.

Column 4, line 63, "$Vf \fallingdotseq Vi$" should be -- $Vf \not\doteqdot Vi$ --.

Column 5, line 16, "1" should be -- a --.

Column 5, line 33, "D6" should be -- D5 --.

Column 5, line 34, "D5" should be -- D6 --.

Signed and sealed this 2nd day of May 1972.

(SEAL)
Attest:

EDWARD M.FLETCHER,JR.
Attesting Officer

ROBERT GOTTSCHALK
Commissioner of Patents